US008246900B2

(12) United States Patent
Kasai et al.

(10) Patent No.: US 8,246,900 B2
(45) Date of Patent: Aug. 21, 2012

(54) ANNEALING APPARATUS

(75) Inventors: Shigeru Kasai, Nirasaki (JP); Hiroyuki Miyashita, Nirasaki (JP); Masatake Yoneda, Nirasaki (JP); Tomohiro Suzuki, Nirasaki (JP); Sumi Tanaka, Nirasaki (JP); Masamichi Nomura, Nirasaki (JP); Miwa Shimizu, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 664 days.

(21) Appl. No.: 12/440,034

(22) PCT Filed: Aug. 31, 2007

(86) PCT No.: PCT/JP2007/067053
§ 371 (c)(1),
(2), (4) Date: Mar. 5, 2009

(87) PCT Pub. No.: WO2008/029742
PCT Pub. Date: Mar. 13, 2008

(65) Prior Publication Data
US 2010/0038833 A1 Feb. 18, 2010

(30) Foreign Application Priority Data

Sep. 5, 2006 (JP) ................. 2006-240420
Feb. 15, 2007 (JP) ................. 2007-034417
Mar. 27, 2007 (JP) ................. 2007-081609

(51) Int. Cl.
*H01L 21/26* (2006.01)
*C21D 1/74* (2006.01)
(52) U.S. Cl. ......... 266/250; 392/407; 392/418; 219/220
(58) Field of Classification Search ................. 266/250; 222/594; 219/201, 220; 392/407, 416, 418, 392/411
See application file for complete search history.

(56) References Cited

U.S. PATENT DOCUMENTS

| 4,806,456 A | 2/1989 | Katoh | |
|---|---|---|---|
| 6,121,579 A * | 9/2000 | Aoki et al. | 219/390 |
| 6,998,777 B2 * | 2/2006 | Suehiro et al. | 313/512 |
| 8,041,197 B2 * | 10/2011 | Kasai et al. | 392/418 |
| 2007/0121086 A1 * | 5/2007 | Imade | 353/102 |

FOREIGN PATENT DOCUMENTS

| JP | 4 207020 | 7/1992 |
|---|---|---|
| JP | 2003-077852 * | 3/2003 |
| JP | 2003 77852 | 3/2003 |
| JP | 2006 59931 | 3/2006 |
| KR | 1990-0001238 | 3/1990 |

* cited by examiner

*Primary Examiner* — Scott Kastler
*Assistant Examiner* — Michael Aboagye
(74) *Attorney, Agent, or Firm* — Oblon, Spivak, McClelland, Maier & Neustadt, L.L.P.

(57) ABSTRACT

Provided is an annealing apparatus, which is free from a problem of reduced light energy efficiency resulted by the reduction of light emission amount due to a heat generation and capable of maintaining stable performance. The apparatus includes: a processing chamber 1 for accommodating a wafer W; heating sources 17a and 17b including LEDs 33 and facing the surface of the wafer W to irradiate light on the wafer W; light-transmitting members 18a and 18b arranged in alignment with the heating sources 17a and 17b to transmit the light emitted from the LEDs 33; cooling members 4a and 4b supporting the light-transmitting members 18a and 18b at opposite side to the processing chamber 1 to make direct contact with the heating sources 17a and 17b and made of a material of high thermal conductivity; and a cooling mechanism for cooling the cooling members 4a and 4b with a coolant.

18 Claims, 13 Drawing Sheets

*FIG.4A*      *FIG.4B*
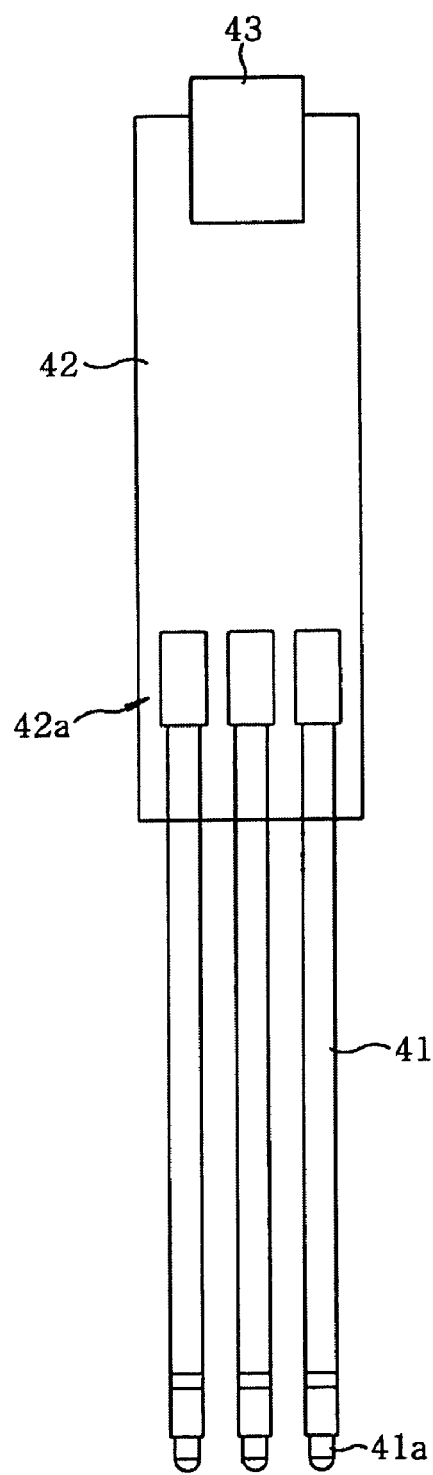
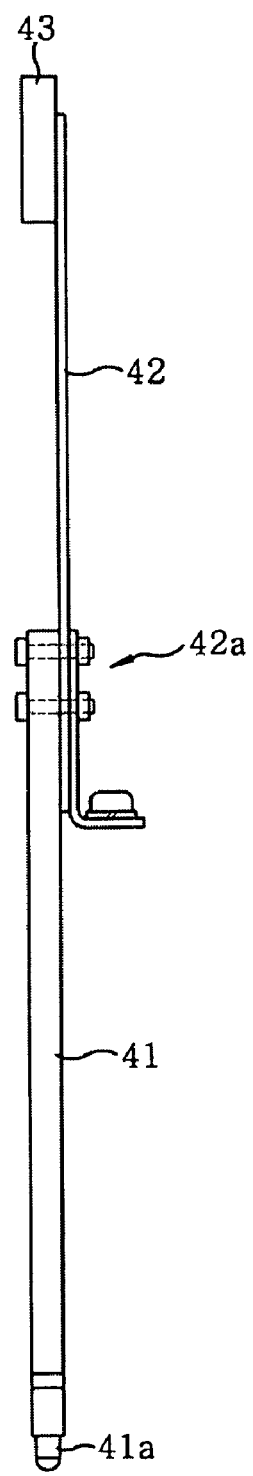

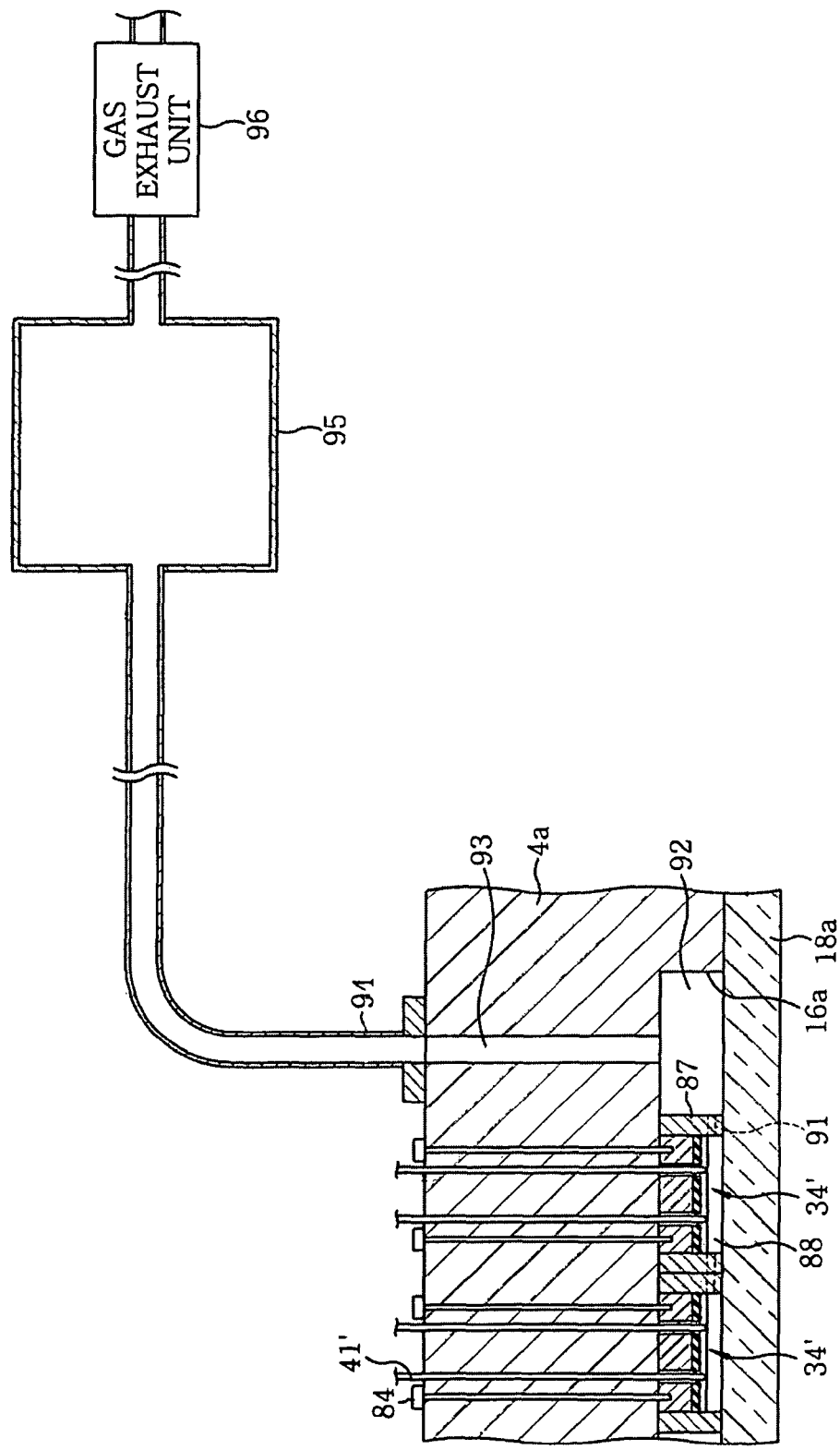

ANNEALING APPARATUS

FIELD OF THE INVENTION

The present invention relates to an annealing apparatus for annealing a semiconductor wafer and the like by irradiating thereto lights emitted from light emitting devices such as LEDs or the like.

BACKGROUND OF THE INVENTION

In a manufacturing process of a semiconductor device, a semiconductor wafer (hereinafter simply referred to as "wafer") as a substrate to be processed is subjected to film formation, oxidative diffusion, modification and various kinds of heat treatments such as annealing and the like. To meet high-speed and high-integration requirements in the semiconductor devices, the annealing performed after ion implantation requires high-speed heating and cooling for the purpose of minimizing diffusion. As an annealing apparatus capable of performing the high-speed heating and cooling, there has been proposed an annealing apparatus that employs LEDs (Light-Emitting Diodes) as a heating source (see, e.g., Patent Document 1).

In case the LEDs are used as a heating source of the annealing apparatus, there is a need to generate a great light energy in keeping with the rapid heating. This makes it necessary to mount the LEDs in high density.

However, it is known that heat (heat generation) reduces the light emission amount of the LEDs. Therefore, if the influence of the heat generated in the LEDs (i.e., the influence of the input energy not converted to light) grows heavier by the high-density mounting of the LEDs, it is difficult to obtain an enough light emission amount from the LEDs. Thus far, no way is known to effectively cool the LEDs and to allow them to make a stable performance.

In addition, the annealing apparatus described above employs a multiplicity of LEDs and therefore has a complicated power supply mechanism. Thus, there is a need for a simple and easy-to-use power supply mechanism.

SUMMARY OF THE INVENTION

In view of the above, it is an object of the present invention to provide an annealing apparatus using light emitting devices such as LEDs or the like as a heating source, which is free from a problem of reduced light energy efficiency resulted by the reduction of light emission amount due to a heat generation and which is capable of maintaining stable performance.

Another object of the present invention is to provide an annealing apparatus capable of supplying a power to light emitting devices in a simple and easy manner.

In accordance with a first aspect of the present invention, there is provided an annealing apparatus including: a processing chamber for accommodating an object to be processed; a heating source including a plurality of light emitting devices and provided to face at least one surface of the object to irradiate light on the object; a light-transmitting member arranged in alignment with the heating source to transmit the light emitted from the light emitting devices; a cooling member supporting the light-transmitting member at opposite side to the processing chamber to make direct contact with the heating source and made of a material of high thermal conductivity; a cooling mechanism for cooling the cooling member with a coolant; a gas exhaust mechanism for exhausting an inside of the processing chamber; and a processing gas supply mechanism for supplying a processing gas into the processing chamber.

In accordance with the first aspect, the heating source may have a plurality of light emitting device arrays each including a support body provided with a rear surface making surface-to-surface contact with the cooling member and made of a material of high thermal conductivity, a plurality of electrodes arranged to make surface-to-surface contact with the support body and a plurality of light emitting devices arranged to make surface-to-surface contact with the electrodes. In this case, the cooling member is preferably made of copper and the support body is made of AlN.

Further, a space may be defined between the cooling member and the light-transmitting member, the heating source being provided in the space. Furthermore, transparent resin may be filled in the space. The transparent resin may includes a relatively hard resin provided in a portion including the light emitting devices at the side of the cooling member and a relatively soft resin provided at the side of the light-transmitting member.

Further, an inert gas may be filled in the space. Besides, the annealing apparatus may further includes an exhaust mechanism for exhausting the space to vacuum and an inert gas supply mechanism for supplying the insert gas into the space.

Further, in the configuration having the light emitting device arrays, a space may be defined between the cooling member and the light-transmitting member, wherein a liquid, which has a refractive index falling between refractive indices of the light emitting devices and the light-transmitting member, is filled in the space and wherein the support body is screw-fixed to the cooling member through a heat transfer layer. In this case, the support body may include an external frame arranged to make contact with the cooling member, the external frame having an inner reflection surface and a liquid through hole.

Further, in accordance with the first aspect, the heating source includes a plurality of light emitting device arrays. Each of the light emitting device array is formed of a unit having: a support body provided to support a plurality of light emitting devices and made of a material of high thermal conductivity; a thermal diffusion member soldered or brazed to a rear surface of the support body and made of a material of high thermal conductivity; a resin layer provided to cover the light emitting devices supported by the support body and made of transparent resin; and a power supply electrode passing through the thermal diffusion member and the support body to supply a power to the light emitting devices, the light emitting device arrays being screw-fixed to the cooling member via paste of high thermal conductivity. In this case, the cooling member and the thermal diffusion member preferably made of copper and the support body is made of AlN.

Further, a space may be defined between the resin layer and the light-transmitting member, and the apparatus may further include an exhaust mechanism for exhausting the space to vacuum. The exhaust mechanism may include an exhaust path communicating with the space, a buffer member provided in the exhaust path and a pump for exhausting the space to vacuum via the exhaust path and the buffer member.

The cooling member may include a plurality of attachment members to which the light emitting device arrays are attached, each of the attachment members having a frame member as a spacer provided to surround the light emitting device arrays and to make contact with the cooling member.

The annealing apparatus may further include a power supply member connected to the power supply electrode via the cooling member for supplying a power to the power supply electrode.

In accordance with a second aspect there is provided an annealing apparatus including: a processing chamber for accommodating an object to be processed; a heating source including a plurality of light emitting devices and provided to face at least one surface of the object to irradiate light on the object; a light-transmitting member arranged in alignment with the heating source to transmit the light emitted from the light emitting devices; a support member for supporting the heating source; and a power supply mechanism provided at a rear surface side of the support member for supplying a power to the light emitting devices via the support member.

The apparatus further includes a gas exhaust mechanism for exhausting an inside of the processing chamber and a processing gas supply mechanism for supplying a processing gas into the processing chamber.

In accordance with the second aspect, the heating source may include a plurality of light emitting device arrays each having: a support body provided at the support member; a plurality of electrodes formed on the support body; a plurality of light emitting devices formed on the electrodes; and a power supply electrode for supplying a power to the light emitting devices, and wherein the power supply mechanism has a plurality of electrode rods connected to the power supply electrode of each of the light emitting device arrays and extending through the support member and a plurality of power supply members through which to supply a power to the electrode rods. The electrode rods and the power supply members may be brought into contact with each other by spring-biased pins.

The light emitting devices are preferably divided to be arranged in each of power supply areas, wherein the power supply area includes a plurality of the power supply electrodes in a corresponding relationship therewith, and wherein the power supply electrodes are arranged along a straight line. In this case, the power supply electrodes may include a plurality of negative electrodes and a common positive electrode. Further, the light emitting devices may be provided in the power supply areas in a form of a parallel connection of a plurality of sets of serially connected light emitting devices.

The light emitting devices may be light-emitting diodes.

In accordance with the first aspect of the present invention, the cooling member made of a material of high thermal conductivity is provided to make direct contact with the heating source and is cooled with a coolant in the cooling mechanism. This makes it possible to effectively cool the light emitting devices by using the cooling member having a heat capacity greater than that of the light emitting devices. Thus the annealing apparatus is free from the problem of reduced light energy efficiency attributable to the reduction in light emission amount caused by the influence of heat and is capable of maintaining stable performance.

The applicant of the prevent invention has filed Japanese Patent Application No. 2006-184457 disclosing a technique for solving the problem of reduced light energy efficiency by directly cooling the LEDs as light emitting devices with a coolant. In the technique, LEDs are cooled with high efficiency by bringing a liquid coolant into direct contact with the LEDs. In order to efficiently cool the LEDs, however, there is a need to bring the coolant into contact with the light-emitting surfaces of the LEDs. This may generate bubbles on the light-emitting surfaces, thereby reducing the light-irradiating efficiency. Further, the cooling efficiency may be insufficient without circulating a low-temperature coolant across the light-emitting surfaces at all times. This makes it necessary to circulate a large quantity of coolant.

In accordance with the first aspect of the present invention, the cooling member made of a material of high thermal conductivity such as copper or the like are cooled by a coolant so that cold heat can be accumulated in the cooling member. The light emitting devices are cooled with the accumulated cold heat. Therefore, the light emitting devices can be sufficiently cooled by the accumulated cold energy without having to circulate a large quantity of coolant during the annealing operation. In addition, there is no need to bring the coolant into contact with the light-emitting surfaces of the light emitting devices, thus excluding the bubble generation problem.

In accordance with the second aspect of the present invention, a power is supplied to the light emitting devices via the support member at the rear surface side of the latter. This makes it possible to supply the power to a multiplicity of light emitting devices in an easy and simple manner.

BRIEF DESCRIPTION OF THE DRAWINGS

FIGS. 4A and 4B are views showing a control board of the annealing apparatus shown in FIG. 1.

FIG. 13 is a view illustrating an exhaust mechanism for exhausting the space to vacuum, the space being defined between a cooling member and a light-transmitting member of the annealing apparatus shown in FIG. 12 after the LED array is mounted in place.

DETAILED DESCRIPTION OF THE PREFERRED EMBODIMENTS

Hereinafter, embodiments of the invention will be described with reference to the accompanying drawings. An annealing apparatus for annealing a wafer of which surface is implanted with impurities will be described herein by way of example.

Figure 1:
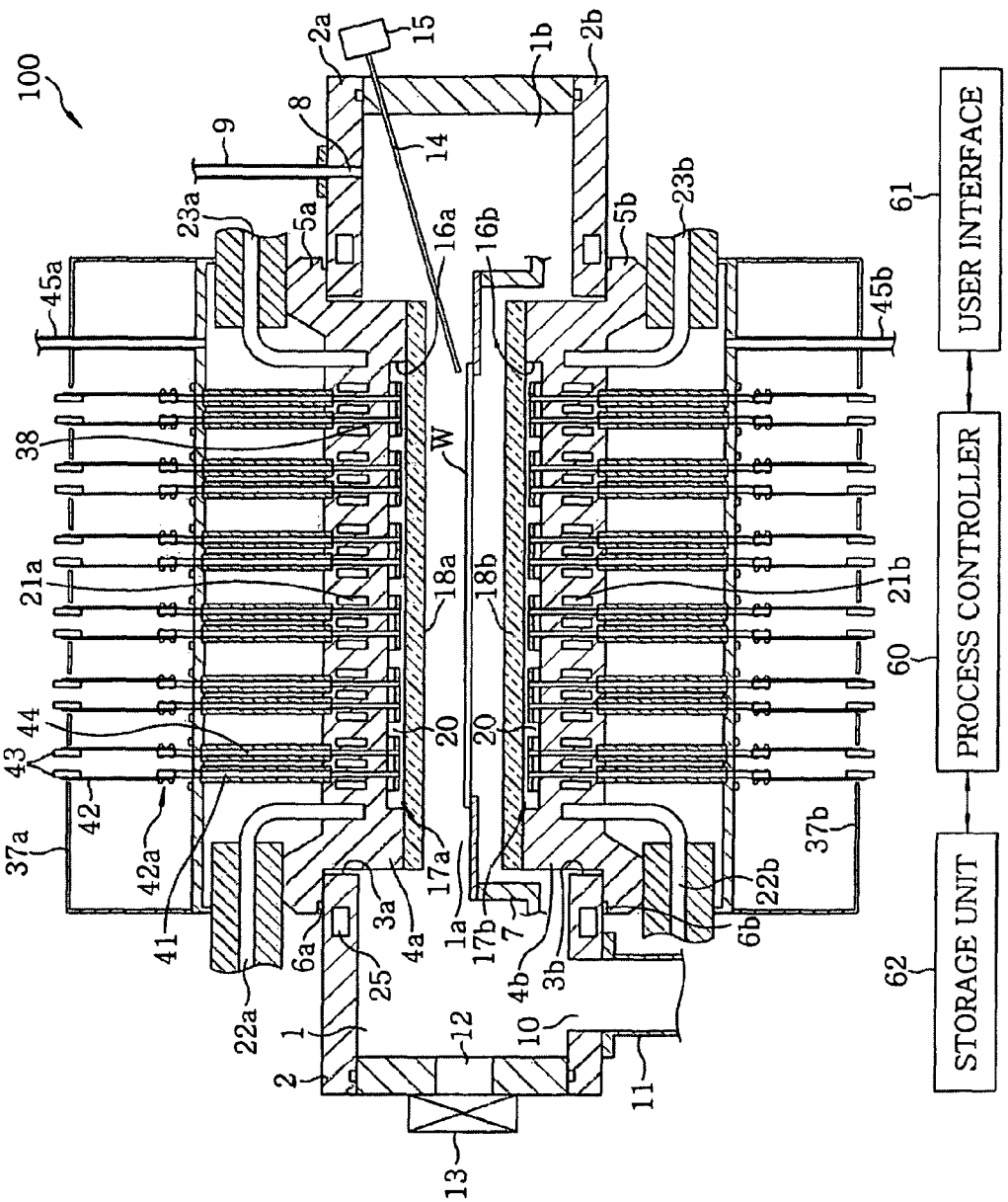
FIG. 1 is a view showing a schematic configuration of an annealing apparatus in accordance with an embodiment of the present invention.
Figure 2:
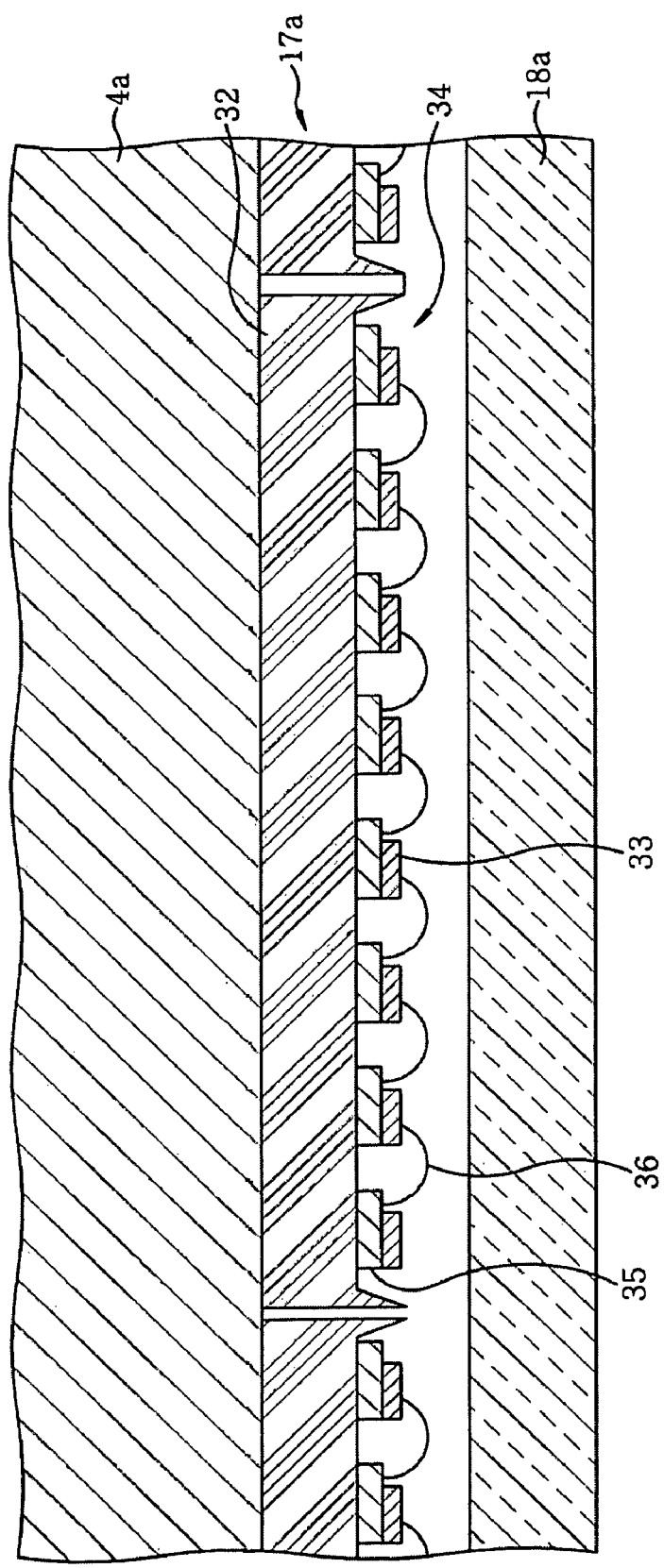
FIG. 2 is an enlarged cross sectional view illustrating a heating source of the annealing apparatus shown in FIG. 1.
Figure 3:
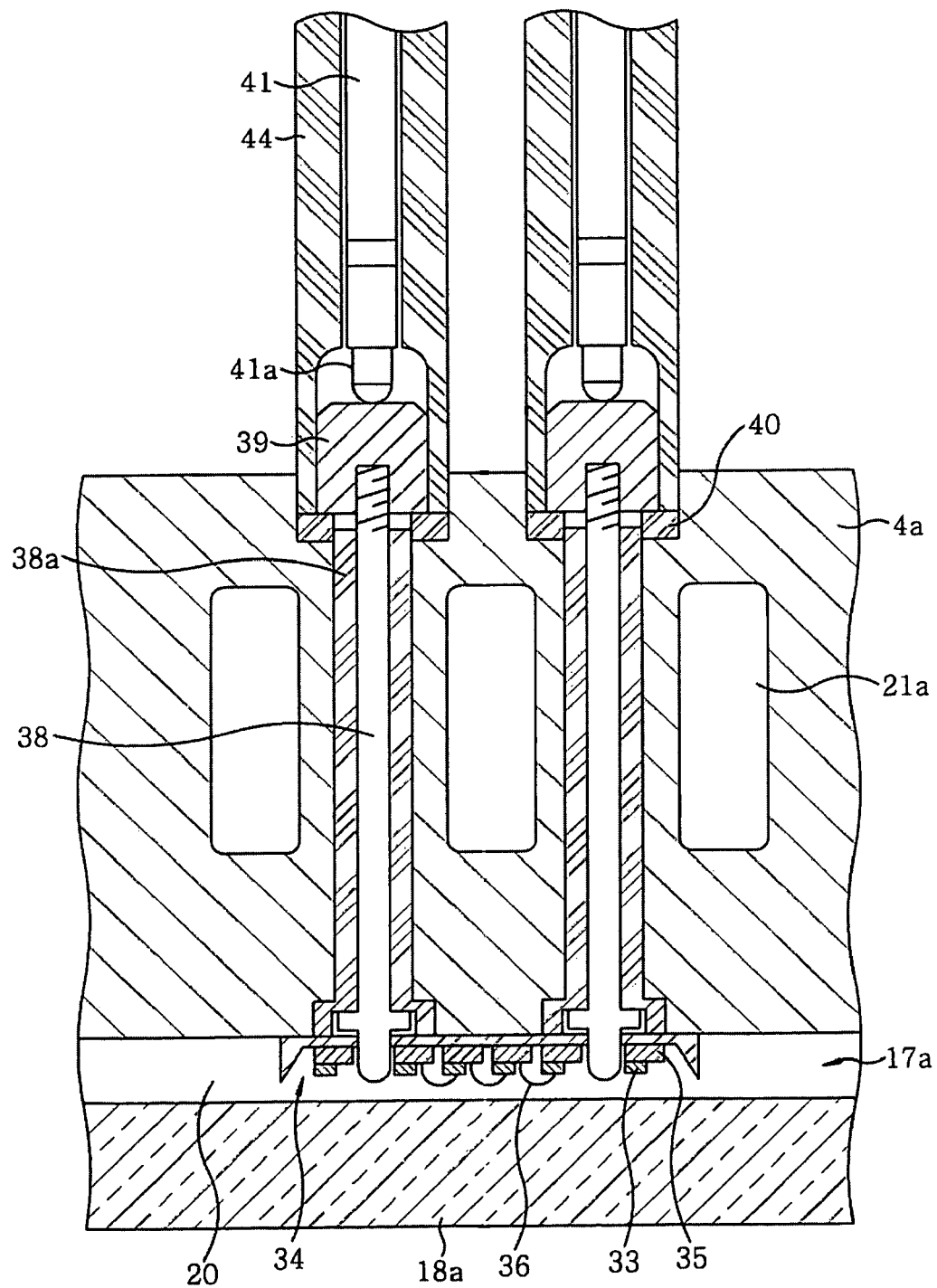
FIG. 3 is an enlarged cross sectional view illustrating the portion through which to supply a power to LEDs of the annealing apparatus shown in FIG. 1.

FIG. 1 is a sectional view showing a schematic configuration of an annealing apparatus in accordance with the embodiment of the present invention. FIG. 2 is an enlarged sectional view illustrating a heating source of the annealing apparatus shown in FIG. 1. FIG. 3 is an enlarged sectional view illustrating the portion through which to supply a power to LEDs of the annealing apparatus shown in FIG. 1. The annealing apparatus 100 includes an airtightly sealed processing chamber 1 into which a wafer W is loaded.

The processing chamber 1 has a cylindrical annealing portion 1a in which the wafer W is positioned and a gas diffusing portion 1b formed in a doughnut shape outside the annealing portion 1a. The gas diffusing portion 1b is greater in height than the annealing portion 1a so that the processing chamber 1 has a H-shaped cross section as a whole. The gas diffusing portion 1b of the processing chamber 1 is defined by a chamber 2. Circular holes 3a and 3b are formed in the top wall 2a and the bottom wall 2b of the chamber 2 in alignment with the annealing portion 1a. Cooling members 4a and 4b made of a highly conductive material such as copper or the like are fitted into these holes 3a and 3b, respectively. The cooling members 4a and 4b are provided with flange portions 5a and 5b that make contact with the top wall 2a and the bottom wall 2b of the chamber 2 via seal members 6a and 6b, respectively. The cooling members 4a and 4b define the annealing portion 1a.

A support member 7 for horizontally mounting the wafer W within the annealing portion 1a is provided in the processing chamber 1. When replacing the wafer W, the support member 7 can be moved up and down by a lifting mechanism (not shown). In the top wall 2a of the chamber 2, there is formed a processing gas inlet opening 8 through which a predetermined processing gas is introduced from a processing gas supply mechanism (not shown). A processing gas line 9 for supplying the processing gas is connected to the processing gas inlet opening 8. A gas exhaust port 10 is formed in the bottom wall 2b of the chamber 2. A gas exhaust line 11 leading to a gas exhaust unit (not shown) is connected to the gas exhaust port 10.

In the side wall of the chamber 2, there is formed a loading/unloading port 12 for loading/unloading the wafer W into and out of the chamber 2. The loading/unloading port 12 can be opened and closed by a gate valve 13. A temperature sensor 14 for measuring the temperature of the wafer W mounted on the support member 7 is provided in the processing chamber 1. The temperature sensor 14 is connected to a measurement unit 15 disposed outside the chamber 2. A temperature detection signal is output from the measurement unit 15 to a process controller 60 which will be described later.

On the surfaces of the cooling members 4a and 4b facing the wafer W mounted on the support member 7, there are formed circular recess portions 16a and 16b in alignment with the wafer W. Within the recess portions 16a and 16b, heating sources 17a and 17b including light-emitting diodes (LEDs) are provided to make direct contact with the cooling members 4a and 4b.

Light-transmitting members 18a and 18b, through which the lights emitted from the LEDs in the heating sources 17a and 17b are transmitted to the wafer W, are screw-fixed to the surfaces of the cooling members 4a and 4b facing the wafer W to cover the recess portions 16a and 16b. The light-transmitting members 18a and 18b are formed with a material that can effectively transmit the lights emitted from the LEDs, e.g., quartz. A transparent resin 20 (see FIGS. 1 and 3) is filled in a space defined by the recess portion 16a and the light-transmitting member 18a and that defined by the recess portion 16b and the light-transmitting member 18b. As the transparent resin 20, a silicone resin and an epoxy resin can be used.

In the resin filling process, it is desirable to fill the transparent resin 20 while evacuating the spaces so that no bubble should remain in the transparent resin 20.

Considering maintenance and repair, it is desirable to use, as the transparent resin 20, a hard resin layer disposed at the side of the LEDs and a soft resin layer disposed at the side of the light-transmitting members 18a and 18b. That is, in a case where some of the LEDs are replaced with new ones, it becomes difficult to detach the light-transmitting members 18a and 18b if the transparent resin 20 is formed of only a hard resin. In contrast, if the transparent resin 20 is formed of only a soft resin, the LEDs are pulled and detached together with the transparent resin 20 while detaching the light-transmitting members 18a and 18b, which makes it difficult to reuse the LEDs. Use of the transparent resin 20 having two-layer structure makes it easy to detach the light-transmitting members 18a and 18b and makes it possible to protect the LEDs when detaching the light-transmitting members 18a and 18b.

The cooling members 4a and 4b are provided with coolant flow paths 21a and 21b through which a liquid phase coolant capable of cooling the cooling members 4a and 4b to 0° C. or less, e.g., about −50° C., flows. As the coolant a fluorine-based inert liquid (a product name of Fluorinert, Galden or the like) can be used. Coolant supply lines 22a and 22b and coolant discharge lines 23a and 23b are connected to the coolant flow paths 21a and 21b. This makes it possible to circulate a coolant through the coolant flow paths 21a and 21b, thereby cooling the cooling members 4a and 4b.

Cooling water flow lines 25, through which cooling water kept at the room temperature flows, are formed in the top wall 2a and the bottom wall 2b of the chamber 2. Accordingly, the temperature of the chamber 2 is prevented from increasing excessively.

As illustrated in FIG. 2 on an enlarged scale, each of the heating sources 17a and 17b includes a plurality of LED arrays 34 each having a support body 32 made of an insulating material with high thermal conductivity, typically an AlN-based ceramic material, and a multiplicity of LEDs 33 mounted on the support body 32. The rear surfaces of the LED arrays 34 are brought into surface-to-surface contact with the bottom surface of the cooling member 4a of the heating source 17a and with the top surface of the cooling member 4b of the heating source 17b by, e.g., soldering.

Highly conductive electrodes 35, copper plated with gold, are provided between the support body 32 and the LEDs 33 of each of the LED arrays 34 in a surface-to-surface contact state. Electrodes 35 and adjacent LEDs 33 are connected by a wire 36. Thus, cold heat is efficiently transferred from the coolant to the cooling members 4a and 4b of high thermal conductivity and then reaches the LEDs 33 via the support body 32 and the electrodes 35 that have high thermal conductivity and make surface-to-surface contact (total contact) with each other. Consequently, the LEDs 33 are cooled in a high efficient manner.

Control boxes 37a and 37b for controlling the supply of electric power to the LEDs 33 are provided above the cooling member 4a and below the cooling member 4b, respectively. Wiring lines extending from a power source (not shown) are connected to the control boxes 37a and 37b. Thus, the supply of the electric power to the LEDs 33 is controlled by the control boxes 37a and 37b.

As illustrated in FIG. 3 on an enlarged scale, electrode rods 38 (not shown in FIG. 2) extending through the cooling members 4a and 4b are connected to the electrodes 35. A plurality of, e.g., eight, electrode rods 38 are provided in each of the LED arrays 34 (only two electrode rods 38 are shown in FIGS. 1 and 3). Each of the electrode rods 38 is covered with a protection cover 38a made of an insulating material. Each of the electrode rods 38 extends from the vicinity of the electrodes 35 to the upper end portion of the cooling member 4a or the lower end portion of the cooling member 4b and is screw coupled with an accommodating member 39. An insulating ring 40 is interposed between the accommodating member 39 and each of the cooling members 4a and 4b. The tip end portion of each of the electrode rods 38 is soldered to one of the electrodes 35. In this regard, solder is filled in gaps between the protection cover 38a and each of the cooling members 4a and 4b and in gaps between the protection cover 38a and each of the electrode rods 38, thereby forming a so-called feed-through.

A plurality of control boards 42 is provided in each of the control boxes 37a and 37b. As shown in FIGS. 4A and 4B, each of the control boards 42 includes a connecting member 42a to which a power supply member 41 corresponding to each electrode rod 38 is connected and a power supply connector 43 to which a wiring line extending from a power supply is connected. Each of the power supply members 41 extends downwards to be connected with the accommodating member 39 coupled with each of the electrode rods 38.

Each of the power supply members 41 is covered with a protection cover 44 made of an insulating material. Each of the power supply members 41 is provided at its tip end with a pogo pin (spring pin) 41a that makes contact with the corresponding accommodating member 39. This ensures that a power is supplied from the control boxes 37a and 37b to the LEDs 33 via the power supply members 41, the electrode rods 38 and the electrodes 35 of the heating sources 17a and 17b. Responsive to the supply of a power, the LEDs 33 emit light to heat the surface of the wafer W, consequently subjecting the wafer W to annealing. The pogo pin 41a is spring-biased toward the accommodating member 39. This makes sure that the power supply members 41 and the electrode rods 38 are kept in contact with each other even when the control boards 42 are installed out of alignment. Although three power supply members 41 are shown in FIGS. 4A and 4B, this is for the sake of illustration.

Figure 5:
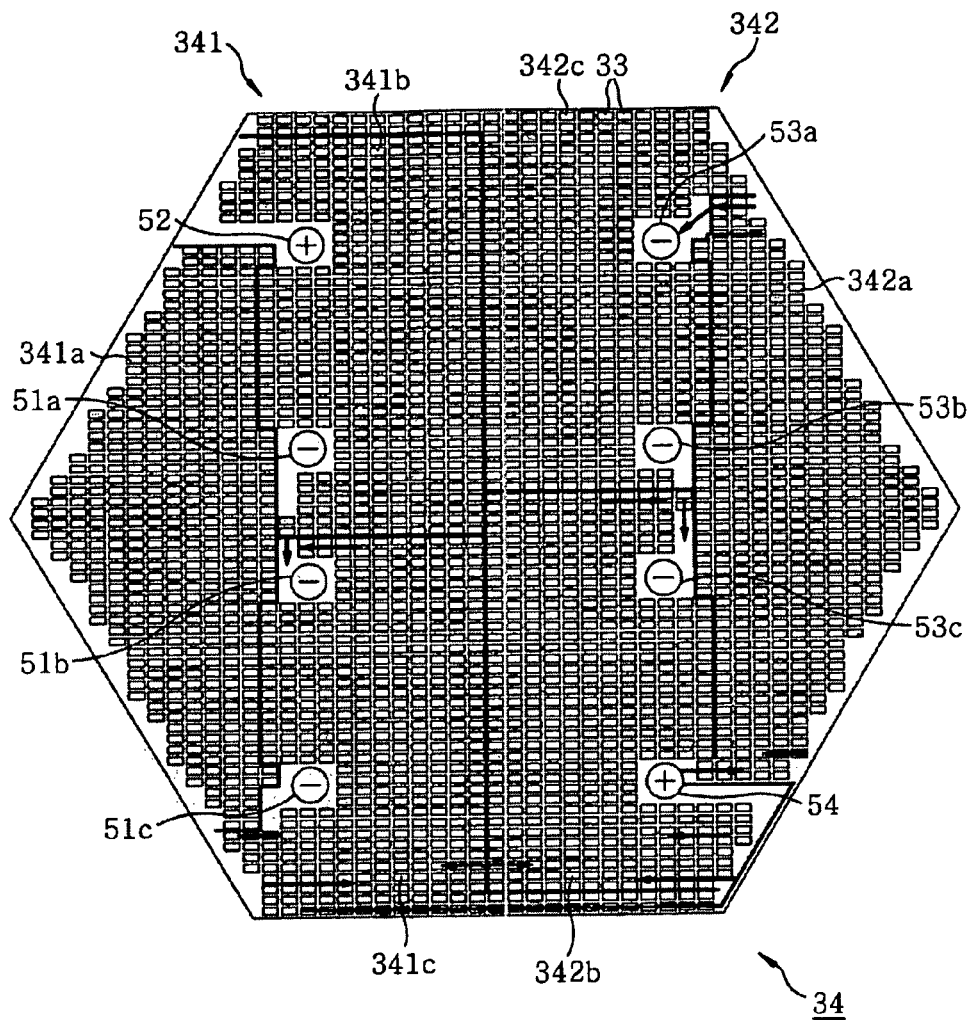
FIG. 5 is a view showing the arrangement of LEDs in an LED array of the annealing apparatus shown in FIG. 1 and illustrating a power supplying method.

Each of the LED arrays 34 has a hexagonal shape as illustrated in FIG. 5 which shows the arrangement of the LEDs 33 in each of the LED arrays 34 and a power supplying method. In each of the LED arrays 34, those are important that a sufficiently high power is supplied to the LEDs 33 and further that a large number of the LEDs 33 is provided while reducing the area loss of a power supplying area. In order to supply a sufficiently high power, each of the LED arrays 34 is divided into six power supply areas. More specifically, two areas 341 and 342 are defined by bisecting each of the LED arrays 34 of hexagonal shape along a line joining the midpoints of two opposing sides. The area 341 is divided into three power supply areas 341a, 341b and 341c and the area 342 is divided into three power supply areas 342a, 342b and 342c.

At this time, each of the areas 341 and 342 is divided in the following manner. Taking the area 341 as an example, the power supply area 341a is a generally triangular area defined by two non-bisected adjoining sides of a hexagon and a rectilinear line joining the distal ends of these adjoining sides. The power supply areas 341b and the 341c are the generally rectangular areas formed by bisecting the remaining area of the area 341 along a rectilinear line parallel to the bisected opposing sides of the hexagon. This holds true in case of the area 342. Specifically, the power supply area 342a is formed of a generally triangular area and the power supply areas 342b and 342c are formed of generally rectangular areas formed by bisecting the remaining area of the area 342.

As the electrodes through which a power is supplied to these power supply areas, three negative electrodes 51a, 51b and 51c and a single common positive electrode 52 are disposed along a straight line in the area 341. Similarly, three negative electrodes 53a, 53b and 53c and a single common positive electrode 54 are arranged along a straight line in the area 342. The reason for arranging these electrodes along a straight line is that there is a need to provide the electrode rods 38 in a region between the coolant flow paths 21a and 21b of the cooling members 4a and 4b.

The common positive electrode 52 supplies a power to the power supply areas 341a, 341b and 342c therethrough, whereas the common positive electrode 54 supplies a power to the power supply areas 342a, 342b and 341c therethrough.

Figure 6:
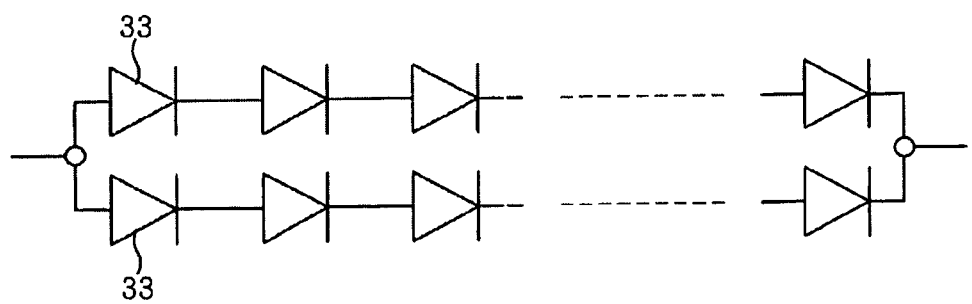
FIG. 6 is a view showing a connection form of LEDs.

Four hundreds of LEDs 33 are arranged in each of the power supply areas. As can be seen in FIG. 6, the LEDs 33 of each of the power supply areas are of a parallel connection of two sets of serially connected LEDs. This makes it possible to reduce the variation between the LEDs and the variation in voltage.

Figure 7:
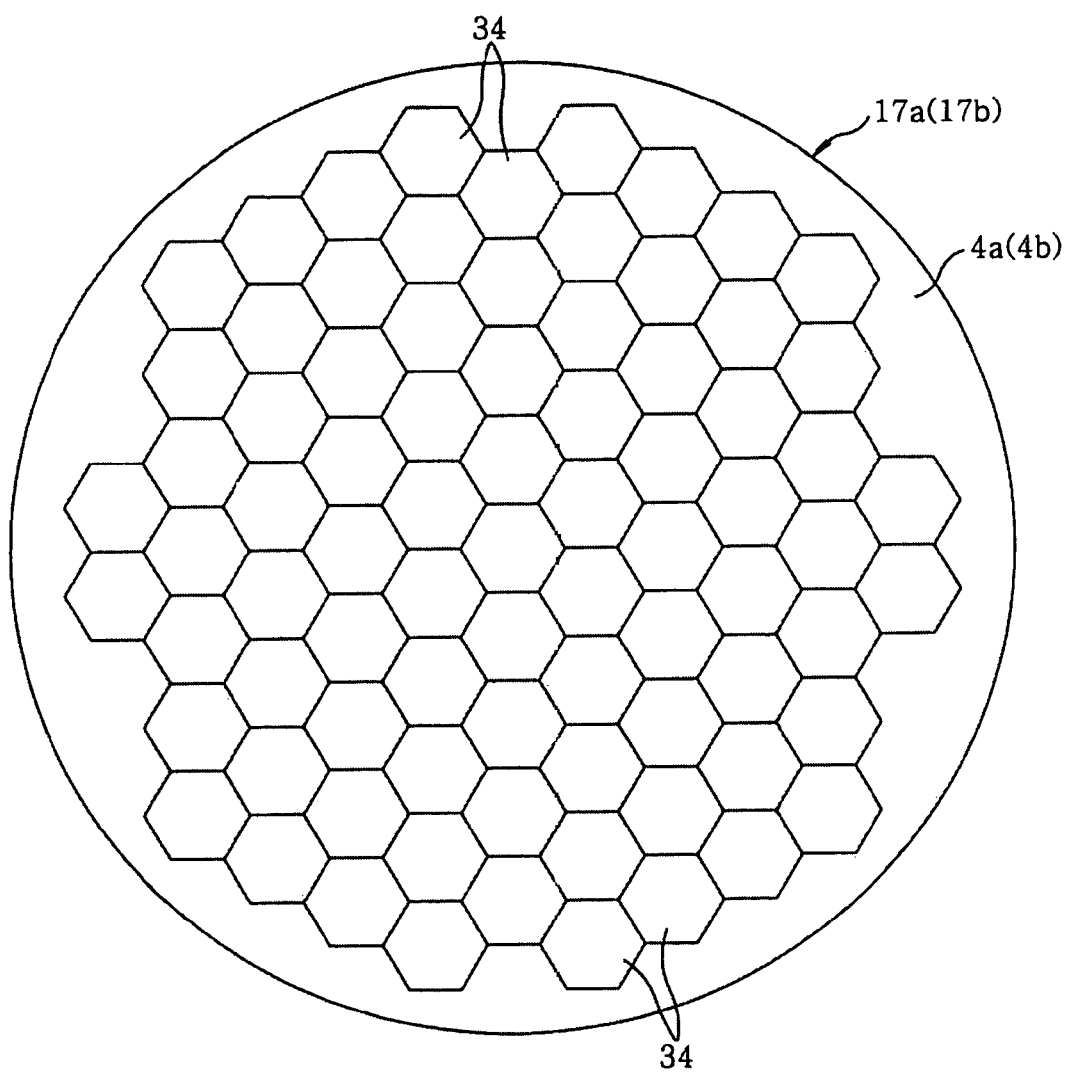
FIG. 7 is a bottom view illustrating the heating source of the annealing apparatus shown in FIG. 1.

The LED arrays 34 having the structure set forth above are provided as illustrated in FIG. 7, for example. 2000~5000 LEDs 33 (2400 LEDs 33 in the afore-mentioned example) are mounted in each of the LED arrays 34. The LEDs 33 used herein may emit light whose wavelength is in a range between an ultraviolet ray wavelength and an infrared ray wavelength, preferably in a range of from 0.36 to 1.0 μm. Examples of such LEDs 33 include compound semiconductors based on GaN, GaAs or the like.

Since the cooling members 4a and 4b are cooled, the regions in which the power supply members 41 are provided are maintained at a low temperature by a cold heat of the cooling members 4a and 4b. Therefore, the power supply members 41 can suffer from electric trouble due to dew condensation if an air of high humidity exists near the power supply members 41. For that reason, a dry gas is introduced into the space between the control boxes 37a and 37b and the cooling members 4a and 4b through gas lines 45a and 45b (see FIG. 1).

Referring again to FIG. 1, the respective component parts of the annealing apparatus 100 are connected to and controlled by a process controller 60 provided with a microprocessor (i.e., a computer). For example, the power control of the control boxes 37a and 37b, the drive system control and the gas supply control are performed by the process controller 60. A user interface 61 is connected to the process controller 60, wherein the user interface 61 includes a key board for a process manager to input commands to operate the annealing apparatus 100 and a display for showing an operational status of the annealing apparatus 100.

A storage unit 62 is connected to the process controller 60. The storage unit 62 stores a control program for enabling the process controller 60 to control various kinds of processing performed in the annealing apparatus 100 and a program, i.e., recipes to be used in operating the respective component parts of the annealing apparatus 100 to carry out processes in accordance with processing conditions. The recipes can be stored in a hard disk or a semiconductor memory, or can be set at a certain position of the storage unit 62 while being recorded on a portable storage medium such as a CDROM, a DVD or the like.

Alternatively, the recipes may be suitably transmitted from other devices to the annealing apparatus 100 through, e.g., a dedicated communication line. If necessary, arbitrary one of the recipes is retrieved from the storage unit 62 under the instructions inputted through the user interface 61 to be executed by the process controller 60. Thus the annealing apparatus 100 performs desired processing under the control of the process controller 60.

Hereinafter, there will be described an annealing operation performed by the annealing apparatus 100. First, the gate valve 13 is opened. Then, the wafer W is loaded into the processing chamber 1 through the loading/unloading port 12 to be mounted on the support member 7. Then the gate valve 13 is closed to keep the processing chamber 1 in an airtightly sealed state. While a specific processing gas, e.g., an argon gas or a nitrogen gas, is introduced from a processing gas supply unit (not shown) into the processing chamber 1 via a processing gas line 9 and a processing gas inlet opening 8, the processing chamber 1 is evacuated through the gas exhaust port 11 by a gas exhaust unit (not shown). Accordingly, the pressure of processing chamber 1 is maintained at a predetermined value in a range of, e.g., from 100 to 10000 Pa.

In the cooling members 4a and 4b, a liquid phase coolant, e.g., a fluorine-based inert liquid (a product name of Fluorinert, Galden or the like) circulates in the coolant flow paths 21a and 21b, thereby cooling the LEDs 33 to a specific temperature of 0° C. or less, preferably −50° C. or less.

Then, the LEDS 33 are turned on by supplying a power from a power supply (not shown) to the LEDs 33 via the control boxes 37a and 37b, the power supply members 41, the electrode rods 38 and the electrodes 35.

If the LEDs 33 are maintained at a room temperature, the light emission amount of the LEDs 33 is reduced by a self-generated heat. In the present embodiment, however, a coolant is allowed to flow through the cooling members 4a and 4b so that the LEDs 33 can be cooled with a cold heat transferred via the cooling members 4a and 4b, the support bodies 32 and the electrodes 35 as shown in FIG. 2. This makes it possible to cool the LEDs 33 with increased efficiency.

In a technique disclosed in Japanese Patent Application No. 2006-184457, LEDs are cooled with increased efficiency by bringing a liquid coolant into direct contact with the LEDs. In order to efficiently cool the LEDs, however, there is a need to bring the coolant into contact with the light-emitting surfaces of the LEDs. This may generate bubbles on the light-emitting surfaces, thereby reducing the light-irradiating efficiency. Furthermore, the cooling efficiency may be reduced unless circulating a low-temperature coolant across the light-emitting surfaces at all times. Therefore, a large quantity of coolant needs to be circulated.

Therefore, in the present invention, the cooling members 4a and 4b made of a material of high thermal conductivity such as copper or the like are cooled by a coolant so that cold heat can be accumulated in the cooling members 4a and 4b to cool the LEDs 33 by the accumulated cold heat. The cooling members 4a and 4b have a heat capacity far greater than that of the LEDs 33. The LEDs 33 are cooled by supplying the cold heat of the cooling members 4a and 4b thereto through the electrodes 35 and the support bodies 32, both of which exhibit high thermal conductivity and make surface-to-surface contact with each other.

Therefore, the LEDs 33 can be sufficiently cooled by the accumulated cold heat without having to circulate a large quantity of coolant during the annealing operation. In addition, there is no need to bring the coolant into contact with the light-emitting surfaces of the LEDs 33, thus preventing the bubble generation. The annealing time is approximately one second per sheet of wafer and the wafer replacing time is about thirty seconds. Thus it is possible to design the annealing apparatus 100 so that the cooling members 4a and 4b can be cooled for the wafer replacing time, i.e., thirty seconds, and the LEDs 33 can be maintained at 100° C. or less during the annealing operation.

In the conventional LED-type annealing apparatus, the differential pressure between a processing chamber kept in a vacuum and an LED accommodating space kept at an atmospheric pressure is withstood by a light-transmitting member made of quartz or the like. Therefore, there is a need to increase the thickness of the light-transmitting member. In the present embodiment, the differential pressure between the processing chamber 1 and the atmosphere is withstood by the metal-made cooling members 4a and 4b, which makes it possible to reduce the thickness of the light-transmitting members 18a and 18b. This restrains accumulation of heat in the light-transmitting members 18a and 18b, thereby making it possible to fully assure thermal insulation between the portions cooled by the cooling members 4a and 4b and the heating portions in the processing chamber 1.

With a view to further enhance the thermal insulation, clamp screws of the light-transmitting members 18a and 18b may preferably be made of a resin or a ceramic of low thermal conductivity. Reduction in thickness of the light-transmitting members 18a and 18b ensures that heat is efficiently radiated from the wafer W toward the cooling members 4a and 4b, thereby improving cooling characteristics of the wafer.

Use of AlN as the support bodies 32 of the LED arrays 34 allows the support bodies 32 not only to reflect the light emitted from the LEDs 33 but also to absorb the radiant heat from the wafer W heated to about 1000° C. This also improves the heating and cooling characteristics.

Since a power is supplied to the LEDs 33 of the LED arrays 34 via the power supply members 41 and the electrode rods 38 at the rear surface side of the cooling members 4a and 4b, it is possible to supply a power to a multiplicity of LEDs 33 in a relatively easy and simple manner. Further, since the pogo pins 41a is used in bringing the power supply members 41 and the accommodating members 39 into contact with each other, it is possible to simply and reliably provide the contact between the power supply members 41 and the electrode rods 38 with the biasing force of a spring even when the control boards 42 are installed out of alignment.

Next, description will be made on certain modified examples of the annealing apparatus of in accordance with the above-described embodiment.

Figure 8:
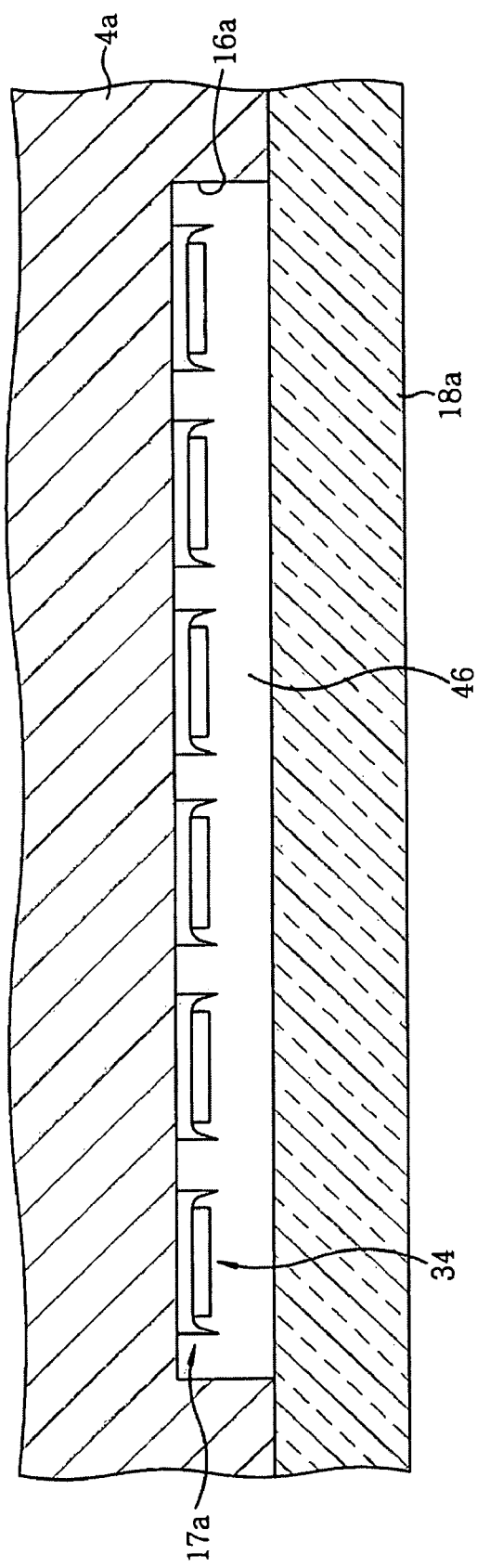
FIG. 8 is a view showing major parts of one modified example of the annealing apparatus shown in FIG. 1.

In a modified example shown in FIG. 8, the spaces between the cooling members 4a and 4b and the light-transmitting members 18a and 18b are filled with an argon gas 46 in place of a resin. In this case, a small amount of ambient air may possibly be introduced through the feed-through. Therefore, it is preferable that the LED arrays 34 are subjected to damp-proof coating.

Figure 9:
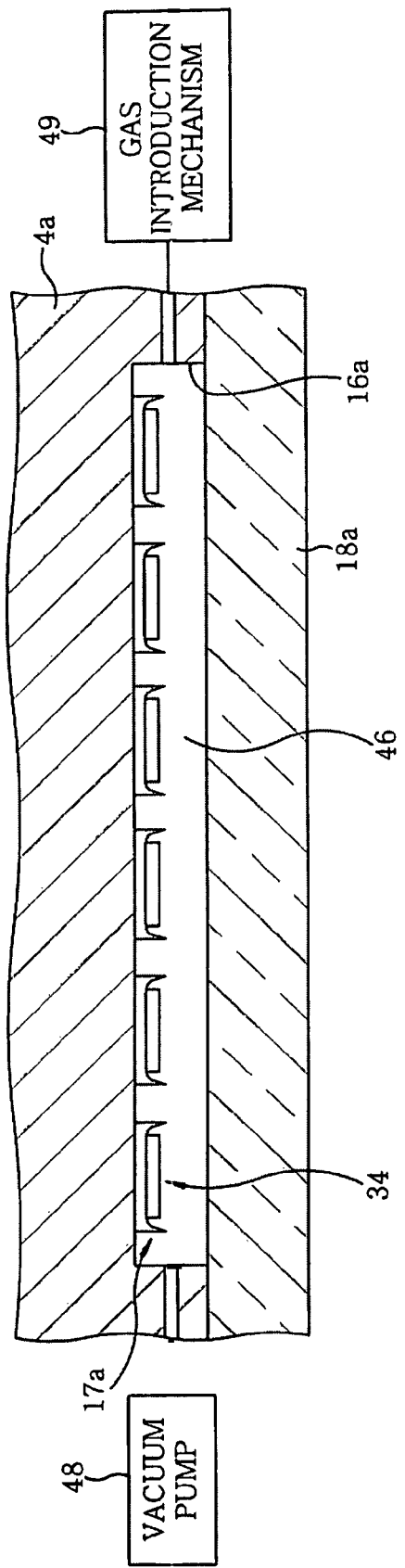
FIG. 9 is a view showing major parts of another modified example of the annealing apparatus shown in FIG. 1.

In a modified example shown in FIG. 9, there are provided a vacuum pump 48 for evacuating the spaces between the cooling members 4a and 4b and the light-transmitting members 18a and 18b and a gas introduction mechanism 49 for introducing an argon gas or the like into the spaces. Therefore, the spaces are kept in a vacuum atmosphere.

Figure 10:
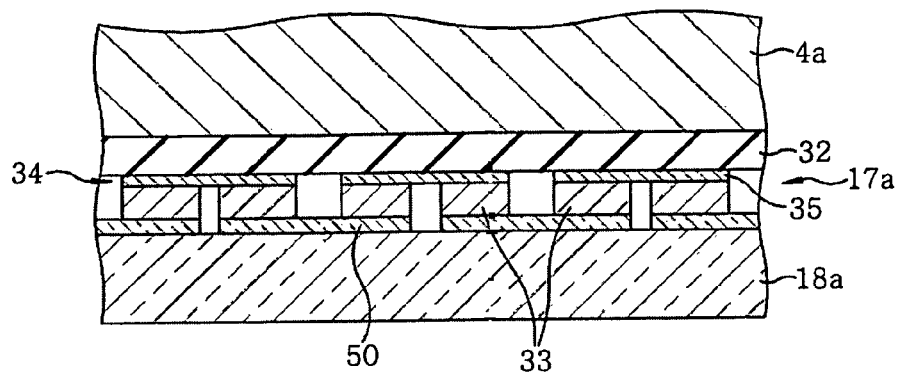
FIG. 10 is a view showing major parts of still another modified example of the annealing apparatus shown in FIG. 1.

In a modified example shown in FIG. 10, transparent electrodes 50 made of ITO (Indium Tin Oxide), IZO (Indium Zinc Oxide) or the like are formed on the light-emitting surfaces of the LEDs 33 and are bonded to the light-transmitting members 18a and 18b, instead of interconnecting the electrodes 35 and the LEDs 33 with the wire 36.

Boiling heat transfer may occur by controlling the coolant temperature during the cooling operation depending on the boiling point of the coolant. The boiling heat transfer allows the coolant to have a temperature higher than the boiling point thereof. Therefore, the cooling operation can be performed by the evaporative latent heat as well as the cold heat of the coolant, which makes it possible to realize a highly efficient cooling operation.

Figure 11:
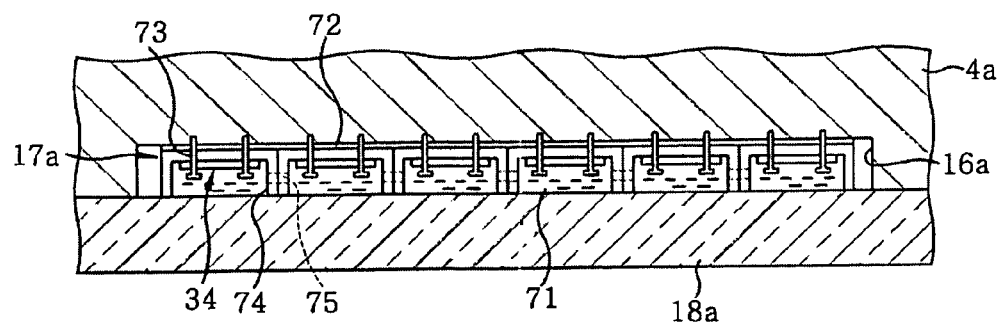
FIG. 11 is a view showing major parts of a still another modified example of the annealing apparatus shown in FIG. 1.

A modified example illustrated in FIG. 11 is made by taking into account the efficient release of light and the ease of maintenance and repair.

In order to efficiently release the light, it is preferable that the transition from the refractive index of a solid light-emitting material to the refractive index of a light-irradiated space occurs gradually. This is the reason why the resin such as silicone or the like is filled around the LEDs 33 and the light-transmitting members 18a and 18b are made of quartz in the embodiment shown in FIG. 1.

In this case, however, the ease of maintenance and repair becomes deteriorated due to the possibility that, when detaching the light-transmitting members 18a and 18b for maintenance purposes, the gel-like resin is peeled off together with the light-transmitting members 18a and 18b, eventually destroying the normal LEDs as well as the defective ones. For realization of the annealing apparatus as shown in FIG. 1, there is a need to use several hundreds of thousands of LEDs. Since it is impossible for all of the LEDs to normally operate for a long period of time, it is preferable that the annealing apparatus is designed to replace the LEDs on a unit-by-unit basis.

If only the ease of maintenance and repair is taken into account, it would be desirable to fill the gas as in the modified example illustrated in FIG. 8. However, this is undesirable in that the transition of the refractive indices does not occur gradually, which leads to reduction in the light efficiency.

In a modified example illustrated in FIG. 11, therefore, a liquid 71, e.g., such as Fluorinert, Galden or Novec is deaerated in advance and then filled in the space where the LEDs exist. The liquid 71 is a liquid in which a gas is insoluble or hardly solved. The liquid 71 has a refractive index, which is equivalent to the midpoint value between the refractive indices of the LEDs and the quartz forming the light-transmitting members, and a low vapor pressure. Since the liquid 71 is deaerated and used merely as a filler with no cooling function, it seldom generates bubbles which may reduce the light irradiation efficiency.

In this modified example, a thermally conductive layer 72 with high thermal conductivity such as a silver paste layer or a silicon grease layer is formed on the rear surfaces of the LED arrays 34. The LED arrays 34 are mounted on the cooling members 4a and 4b by screws 73. When performing maintenance and repair or replacement of the LEDs, the LED arrays 34 can be easily detached by detaching the light-transmitting members 18a and 18b, draining the liquid 71 and loosening the screws 73. In this case, the screws 73 may be used independently, but it is preferable that the screws 73 are used in combination with washers or leaf springs made of a material of high Young's modulus, e.g., $Si_3N_4$.

In this modified example, each of the LED arrays 34 is provided with an external frame 74 leading to each of the light-transmitting members 18a and 18b. The external frame 74 serves as a reflector plate and a support member for supporting each of the light-transmitting members 18a and 18b. This makes it possible to further increase the light irradiation efficiency and to further reduce the thickness of the light-transmitting members 18a and 18b. The external frame 74 has liquid through holes 75 through which the liquid 71 is dispersed over the space where the LEDs 33 exists. The operation of filling the liquid 71 is performed by a suitable method after the light-transmitting members 18a and 18b are mounted in place.

Figure 12:
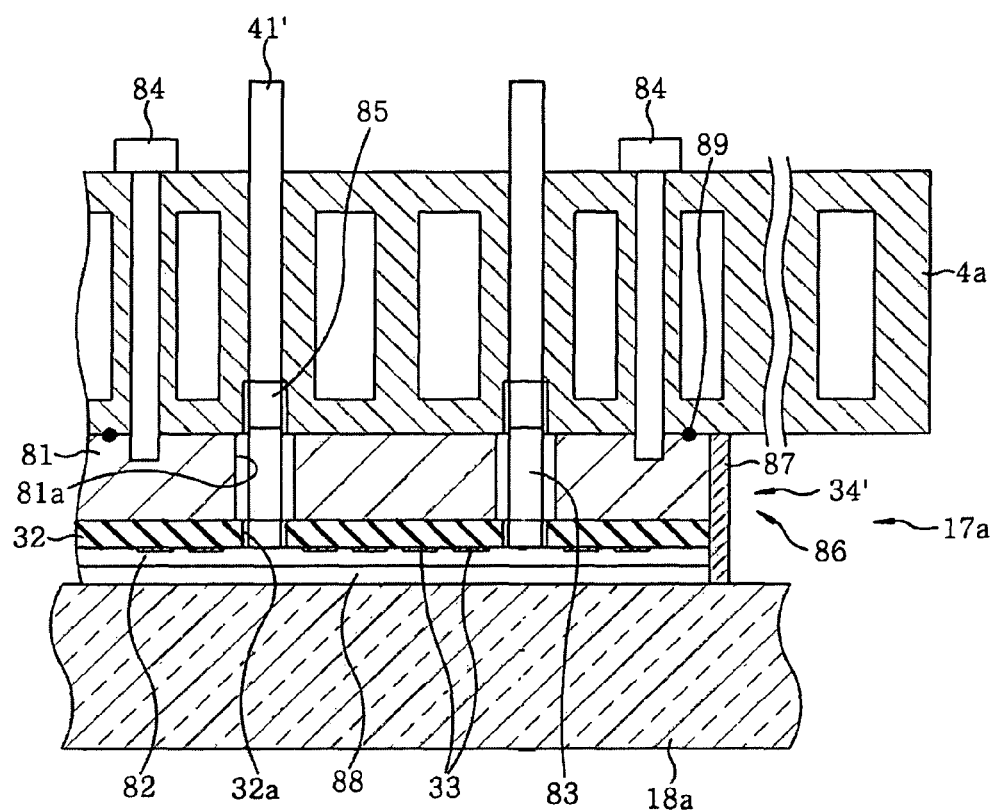
FIG. 12 is a view showing major parts of a still another modified example of the annealing apparatus shown in FIG. 1.

FIG. 12 illustrates a modified example by which the ease of maintenance and repair, particularly the ease of replacement of the LEDs, is increased without reducing the cooling efficiency.

It is important to cool the LEDs 33 when they emit light with high power. For that reason, there is a need to strongly bond the LEDs 33 to the cooling surfaces by soldering or other bonding methods. In case of an apparatus that performs rapid heating of a wafer by using LEDs, the repair and replacement of LEDs is very important and therefore the ease of replacement needs to be higher than that offered by the configuration illustrated in FIG. 11.

In a modified example illustrated in FIG. 12, a heating source 17a or 17b includes a plurality of LED arrays 34', each of which is formed of a unit including: a support body 32 disposed to support a multiplicity of LEDs 33 and made of a material with high thermal conductivity, e.g., AlN; a thermal diffusion member 81 soldered or brazed to the rear surface of the support body 32 and made of a material of high thermal conductivity, e.g., Cu; a resin layer 82 provided to cover the LEDs 33 supported by the support body 32 and made of, e.g., a silicon-based transparent resin (a resin lens or a resin mold); and a power supply electrode 83 for supplying a power to the LEDs 33, the power supply electrode 83 being inserted into and penetrated through a through-hole 81a of the thermal diffusion member 81 and a through-hole 32a of the support body 32. The LED arrays 34' are fixed by screws 84 to the cooling member 4a or 4b via paste such as silicon grease, silver paste or the like of high thermal conductivity. A seal ring 89 is interposed between the cooling member 4a or 4b and the thermal diffusion member 81.

The power supply electrode 83 is provided with ports 85 disposed at a corresponding position at a rear side of the thermal diffusion member 81. Therefore, each of the power supply members 41' passing through the cooling members 4a and 4b (only 4a shown in FIG. 12) is connected to the power supply electrode 83 via each of the ports 85.

Each of the cooling members 4a and 4b includes a plurality of attachment portions 86 to which the LED arrays 34' are attached. Each of the attachment portions 86 has a frame member 87 that functions as a spacer making contact with the light-transmitting member 18a or 18b. The frame member 87 is attached to surround the attachment region of each of the LED arrays 34'. A space 88 kept in vacuum exist between the resin layer 82 of each of the LED arrays 34' attached to the attachment portions 86 and the light-transmitting member 18a or 18b.

As shown in FIG. 13, the cooling member 4a has a gas passage 93 communicating with a space 92 defined by a recess 16a when the light-transmitting member 18a is mounted to the cooling member 4a. A gas exhaust line 94 is connected to the gas passage 93 of the cooling member 4a. The gas passage 93 and the gas exhaust line 94 form a gas exhaust path. A buffer member 95 having a buffer space greater in diameter than the gas exhaust line 94 is provided during the gas exhaust line 94. The space 88 is evacuated by a gas exhaust unit 96 via the gas passage 93, the gas exhaust line 94 and the buffer member 95 to be kept in a vacuum state. This is also applied to the cooling member 4b. The space 88 is small and therefore would be hardly depressurized by a typical evacuation operation. Provision of the buffer space makes it possible to easily evacuate the space 88.

A gas exhaust hole 91 is formed in the frame member 87 so that all of the spaces 88 can be evacuated via the gas exhaust hole 91.

In case of the embodiment shown in FIG. 1, a resin is filled between the cooling members 4a and 4b and the light-transmitting members 18a and 18b. Due to the increase in the filling quantity of the resin, a difficulty may be encountered in filling the resin and the efficiency of the LEDs may be reduced due to bubbles or the like. In the modified example illustrated in FIGS. 12 and 13, however, the resin layer 82 is formed in a small thickness to merely cover the LEDs 33. The remaining space is evacuated as mentioned above. This makes it possible to avoid the drawbacks inherent in the embodiment shown in FIG. 1.

Next, the steps of assembling the LED arrays 34' and the cooling members 4a and 4b together and the steps of mounting the LED arrays 34' in place will be described with reference to FIGS. 14A to 14I.

Figure 14A:
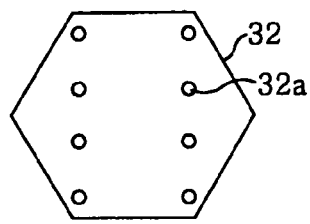
FIGS. 14A to 14I are views illustrating the steps of assembling the LED array and the cooling member together and the steps of mounting the LED array in place.
Figure 14B:
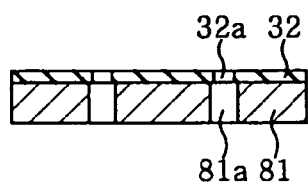
Figure 14C:
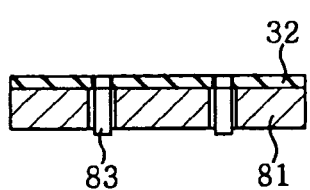
Figure 14D:
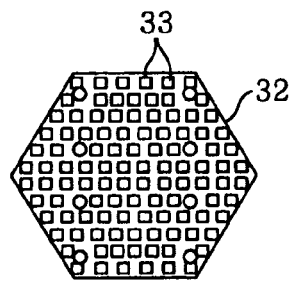
Figure 14E:
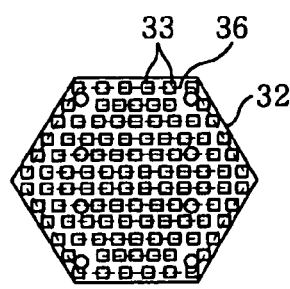
Figure 14F:
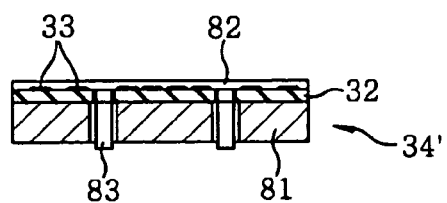
Figure 14G:
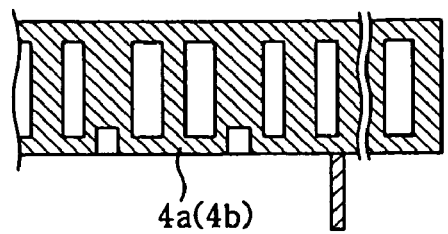

First, the support body 32 having a hexagonal shape is cut from an AlN-made plate material and the through-holes 32a through which the power supply electrodes and the screws are inserted are formed in the support body 32 (see FIG. 14A). Then, the front surface of the copper-made thermal diffusion member 81 having the same shape as the support body 32 and having the through-holes 81a formed in alignment with the through-holes 32a is bonded to the rear surface of the support body 32 by the soldering that makes use of solder paste (see FIG. 14B). The power supply electrodes 83 are inserted into the through-holes 32a and 81a to pass through the support body 32 and the thermal diffusion member 81 and are soldered to the support body 32 (see FIG. 14C).

Thereafter, solder paste is put on the front surface of the support body 32 and the LEDs 33 are placed on the solder paste. In this state, the support body 32 and the LEDs 33 are heat-treated and soldered in a batch furnace (see FIG. 14D). A bonding operation is performed by using the wire 36 (see FIG. 14E). In order to protect the LEDs 33 and to adjust the refractive index, the LEDs 33 are covered with a transparent resin (a resin lens or a resin mold) to thereby form the resin layer 82. An epoxy-based resin is filled in the space between the power supply electrodes 83 and the through-holes 81a to provide a hermetic seal, thereby producing the LED array 34' (see FIG. 14F). Concurrently with the above operation, the cooling member 4a or 4b is fabricated (see FIG. 14G).

Figure 14H:
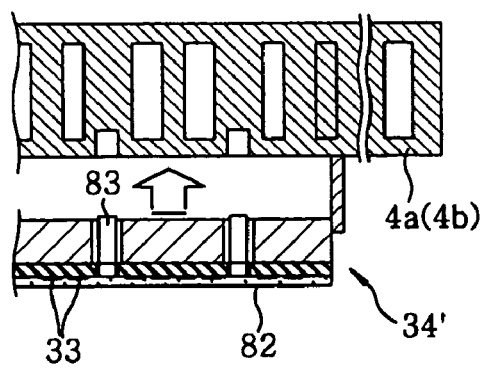
Figure 14I:
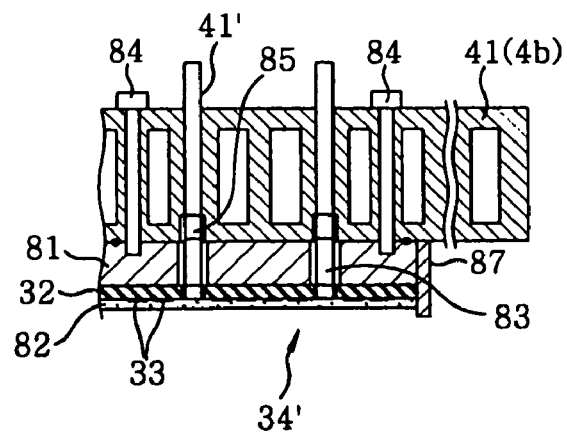

Thereafter, the LED array 34' is mounted to the cooling member 4a or 4b (see FIG. 14H). The power supply members 41' are connected to the power supply electrodes 83 and the LED array 34' is fixed to the cooling member 4a or 4b by screws 84 (see FIG. 14I).

The operation of mounting the LED array 34' is completed through the steps described above. Subsequently, the light-transmitting member 18a or 18b is mounted in place to establish the state shown in FIG. 12.

As described above, the LED array 34' is formed into a unit and attached to the cooling member 4a or 4b by the screws 84 in the annealing apparatus shown in FIG. 12. Therefore, the LED array 34' can be attached and detached with ease. Since the LED array 34' can be easily replaced on a unit-by-unit basis when there is a need to replace the LEDs 33, it is possible to greatly increase the ease of maintenance and repair. Further, the AlN-made support body 32 and the copper-made thermal diffusion member 81 are brought into surface-to-surface contact with each other by soldering (with cream solder). The thermal diffusion member 81 and the cooling member 4a or 4b are also brought into surface-to-surface contact with each other by using paste such as silicon grease, silver paste or the like of high thermal conductivity. Therefore, the LEDs 33 can be cooled with a reduced thermal resistance.

In the space defined between the cooling member 4a or 4b and the light-transmitting member 18a or 18b, only the portion where the LEDs 33 is installed is covered with the resin layer 82. The remaining space 82 is evacuated. This makes it possible to avoid the difficulty which can be encountered when the whole space is filled with a resin as mentioned earlier. It is also possible to mitigate the reduction in light irradiation efficiency which can be caused by the difference in refractive index between the LEDs 33 and the vacuum space when the whole space is evacuated without forming the resin layer 82.

In other words, use of the resin layer 82 provides a structure in which the LEDs 33, the resin layer 82 and the space 88 have gradually decreasing refractive indices. The total reflection of light which can arise from the big difference between the refractive indices is hard to occur, thereby preventing the reduction in light irradiation efficiency.

The present invention is not limited to the embodiment and the modified examples described above but may be changed or modified in many different forms. For example, although the afore-mentioned embodiment is directed to an example in which the heating sources with LEDs are provided at the opposite sides of the wafer as an object to be processed, it may be possible to provide a single heating source at only one side of the wafer. Although LEDs are used as the light emitting devices in the afore-mentioned embodiment, it may be possible to use other light emitting devices such as a semiconductor laser and the like. The object to be processed is not limited to the semiconductor wafer but may be other objects such as a glass substrate for flat panel displays and the like.

INDUSTRIAL APPLICABILITY

The present invention can be appropriately used to perform rapid heating, e.g., in annealing a semiconductor wafer after impurities are implanted into the same.

What is claimed is:

1. An annealing apparatus comprising:
a processing chamber for accommodating an object to be processed;
a heating source including a plurality of light emitting devices, said heating source and provided to face at least one surface of the object to irradiate light on the object;
a light-transmitting member arranged in alignment with the heating source to transmit the light emitted from the light emitting devices;
a cooling member supporting the light-transmitting member at opposite side to the processing chamber to make direct contact with the heating source and made of a material of high thermal conductivity;
a cooling mechanism for cooling the cooling member with a coolant;
a gas exhaust mechanism for exhausting an inside of the processing chamber; and
a processing gas supply mechanism for supplying a processing gas into the processing chamber,
wherein the heating source comprises a plurality of light emitting device arrays, each of which is formed of a unit including:
a support body provided to support a plurality of light emitting devices and made of a material of high thermal conductivity;
a thermal diffusion member attached to a rear surface of the support body and made of a material of high thermal conductivity;
a resin layer provided to cover the light emitting devices supported by the support body and made of transparent resin; and
a power supply electrode passing through the thermal diffusion member and the support body to supply a power to the light emitting devices, the light emitting device arrays being screw-fixed to the cooling member via paste of high thermal conductivity.

2. The annealing apparatus of claim 1, wherein the heating source comprises a plurality of light emitting device arrays each including a support body provided with a rear surface making surface-to-surface contact with the cooling member and made of a material of high thermal conductivity, a plurality of electrodes arranged to make surface-to-surface contact with the support body and a plurality of light emitting devices arranged to make surface-to-surface contact with the electrodes.

3. The annealing apparatus of claim 2, wherein the cooling member is made of copper and the support body is made of AlN.

4. The annealing apparatus of claim 1, wherein a space is defined between the cooling member and the light-transmitting member, the heating source being provided in the space.

5. The annealing apparatus of claim 4, wherein a transparent resin is filled in the space.

6. The annealing apparatus of claim 5, wherein the transparent resin comprises a relatively hard resin provided in a portion including the light emitting devices at the side of the cooling member and a relatively soft resin provided at the side of the light-transmitting member.

7. The annealing apparatus of claim 4, wherein an inert gas is filled in the space.

8. The annealing apparatus of claim 7, further comprising an exhaust mechanism for exhausting the space to vacuum and an inert gas supply mechanism for supplying the insert gas into the space.

9. The annealing apparatus of claim 1,
wherein the thermal diffusion member is soldered or brazed to the rear surface of the support body and made of a material of high thermal conductivity.

10. The annealing apparatus of claim 9, wherein the cooling member and the thermal diffusion member are made of copper and the support body is made of AlN.

11. The annealing apparatus of claim 9, wherein a space is defined between the resin layer and the light-transmitting member, and further comprising an exhaust mechanism for exhausting the space to vacuum.

12. The annealing apparatus of claim 11, wherein the exhaust mechanism includes an exhaust path communicating with the space, a buffer member provided in the exhaust path and a pump for exhausting the space to vacuum via the exhaust path and the buffer member.

13. The annealing apparatus of claim 11, wherein the cooling member includes a plurality of attachment members to which the light emitting device arrays are attached, each of the attachment members having a frame member as a spacer provided to surround the light emitting device arrays and to make contact with the cooling member.

14. The annealing apparatus of claim 9, further comprising a power supply member connected to the power supply electrode via the cooling member for supplying a power to the power supply electrode.

15. The annealing apparatus of claim 1, wherein the light emitting devices are light-emitting diodes.

16. An annealing apparatus comprising:
a processing chamber for accommodating an object to be processed;
a heating source including a plurality of light emitting devices, said heating source and provided to face at least one surface of the object to irradiate light on the object;
a light-transmitting member arranged in alignment with the heating source to transmit the light emitted from the light emitting devices;
a cooling member supporting the light-transmitting member at opposite side to the processing chamber to make direct contact with the heating source and made of a material of high thermal conductivity;
a cooling mechanism for cooling the cooling member with a coolant;
a gas exhaust mechanism for exhausting an inside of the processing chamber; and
a processing gas supply mechanism for supplying a processing gas into the processing chamber,
wherein the heating source comprises a plurality of light emitting device arrays each including a support body provided with a rear surface making surface-to-surface contact with the cooling member and made of a material of high thermal conductivity, a plurality of electrodes arranged to make surface-to-surface contact with the support body and a plurality of light emitting devices arranged to make surface-to-surface contact with the electrodes, and
wherein a space is defined between the cooling member and the light-transmitting member, wherein a liquid, which has a refractive index falling between refractive indices of the light emitting devices and the light-transmitting member, is filled in the space and wherein the support body is screw-fixed to the cooling member through a heat transfer layer.

17. The annealing apparatus of claim 16, wherein the support body includes an external frame arranged to make contact with the cooling member, the external frame having an inner reflection surface and a liquid through hole.

18. The annealing apparatus of claim 16, wherein the light emitting devices are light-emitting diodes.

* * * * *

UNITED STATES PATENT AND TRADEMARK OFFICE
CERTIFICATE OF CORRECTION

| | |
|---|---|
| PATENT NO. | : 8,246,900 B2 |
| APPLICATION NO. | : 12/440034 |
| DATED | : August 21, 2012 |
| INVENTOR(S) | : Shigeru Kasai et al. |

It is certified that error appears in the above-identified patent and that said Letters Patent is hereby corrected as shown below:

In the Claims:

Column 14, Claim 1, line 39, after "heating source" delete the word "and".

Column 16, Claim 16, line 13, after "heating source" delete the word "and".

Signed and Sealed this
Eighth Day of January, 2013

David J. Kappos
*Director of the United States Patent and Trademark Office*